(12) United States Patent
Chen

(10) Patent No.: US 7,146,699 B2
(45) Date of Patent: Dec. 12, 2006

(54) SCREW ALIGNMENT TOOL

(75) Inventor: Wen-Chi Chen, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 176 days.

(21) Appl. No.: 10/879,885

(22) Filed: Jun. 29, 2004

(65) Prior Publication Data

US 2005/0125979 A1    Jun. 16, 2005

(30) Foreign Application Priority Data

Dec. 16, 2003 (TW) .............................. 92222003 U

(51) Int. Cl.
*B25B 1/20* (2006.01)
(52) U.S. Cl. .................................................. 29/281.5
(58) Field of Classification Search ............... 29/281.1, 29/281.5, 70.1; 269/87.3; 408/115 R, 115 B
See application file for complete search history.

(56) References Cited

U.S. PATENT DOCUMENTS 4,790,695 A * 12/1988 Abernethy ................. 269/87.3

* cited by examiner

*Primary Examiner*—Robert C. Watson
(74) *Attorney, Agent, or Firm*—Thomas, Kayden, Horstemeyer & Risley

(57) ABSTRACT

A screw alignment tool. The tool includes a base, a cover and a plurality of extending elements. The base has a plurality of fasteners, fixing two work pieces. The cover is disposed on the base through a connecting means and has a plurality of holes corresponding to the screw holes on the work pieces. The extending elements are disposed on the cover by the holes facing the base. Each extending element has a chute communicating with the hole of the cover. When the cover is moved to a predetermined operating position, the chutes are aligned with the screw holes, to better align screw mounting.

13 Claims, 4 Drawing Sheets

SCREW ALIGNMENT TOOL

BACKGROUND OF THE INVENTION

1. Field of the Invention

The present invention relates to an alignment tool, and in particular to an alignment tool for product assembly in fabrication lines of factories.

2. Description of the Related Art

Currently, products in fabrication lines of factories are frequently assembled using electric screwdrivers, shortening fabrication time and reducing cost.

When products are manually assembled, However, screws are not easily aligned with screw holes, often increasing fabrication time. In addition, dedicated or brittle components, such as PCBs, may be damaged by inaccurate screw mounting angle, further increasing production costs. Hence, there is a need for a more precisely aligned screw mounting tool in fabrication.

SUMMARY OF THE INVENTION

Accordingly, an object of the invention is to provide a screw alignment tool with an easily operated structure to solve the above alignment problems.

The present invention provides a screw alignment tool comprising a base, a cover and a plurality of extending elements. The base comprises a plurality of fasteners, fixing two work pieces. The cover is disposed on the base by a connecting means and has a plurality of holes corresponding to the screw holes on the work pieces. The extending elements are disposed on the cover by the holes facing the base. Each extending element has a chute communicating with the hole of the cover. When the cover is moved to a predetermined operating position, the chutes are precisely aligned with the screw holes.

In a preferred embodiment, the base has a track and the cover is slidably disposed on the base via the track or pivots on the base by a shaft.

The base has a plurality of fastener, fixing the work piece. The extending elements are cylinders or tapered cylinders, of plastic or metal. The chutes are conical or circular.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings which are given by way of illustration only, and thus are not limitation of the present invention, and wherein.

DETAILED DESCRIPTION OF THE INVENTION

First Embodiment

Figure 1A:
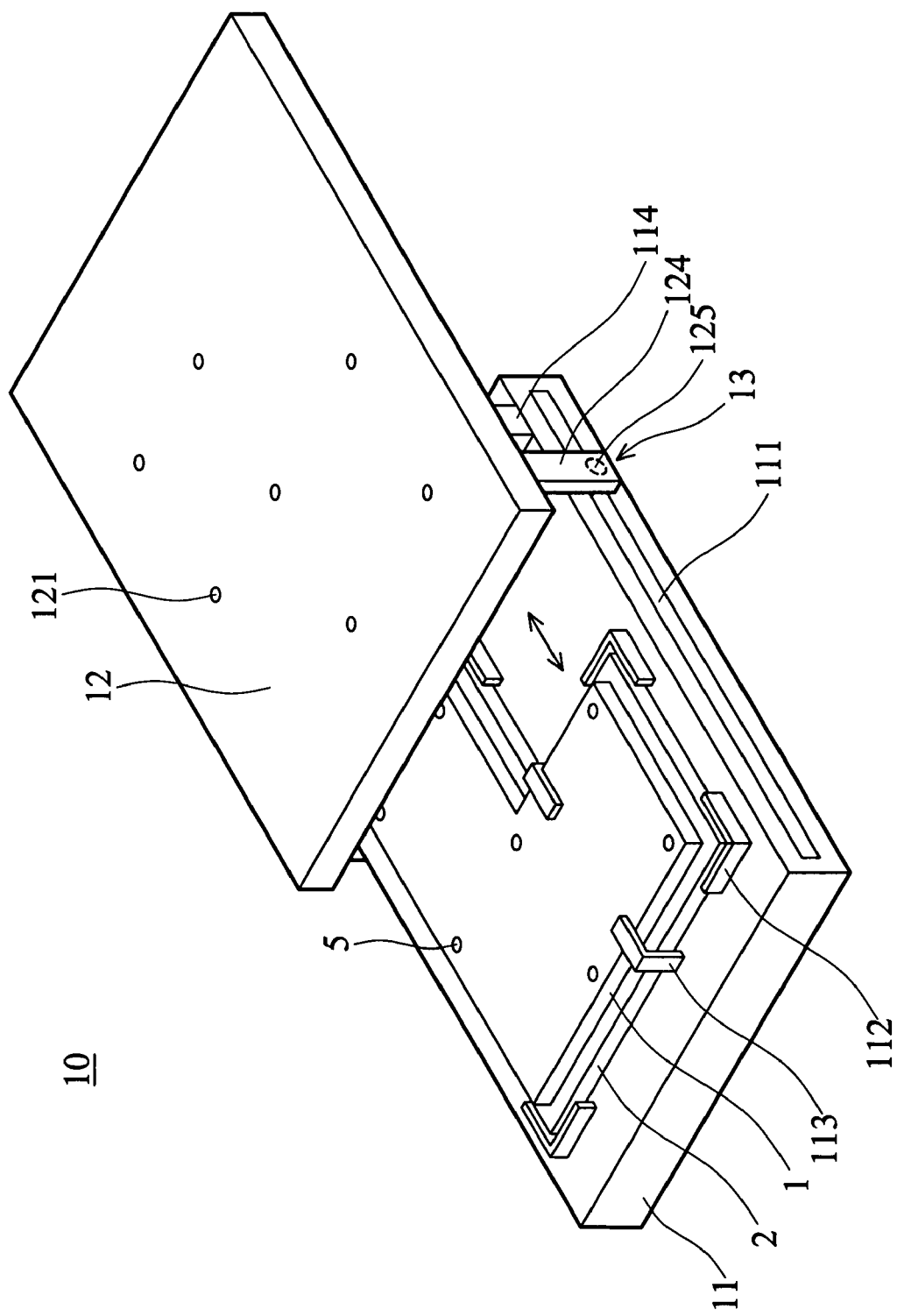
FIG. 1A is a perspective view of the screw alignment tool in a first embodiment of the invention with the cover withdrawn.
Figure 1B:
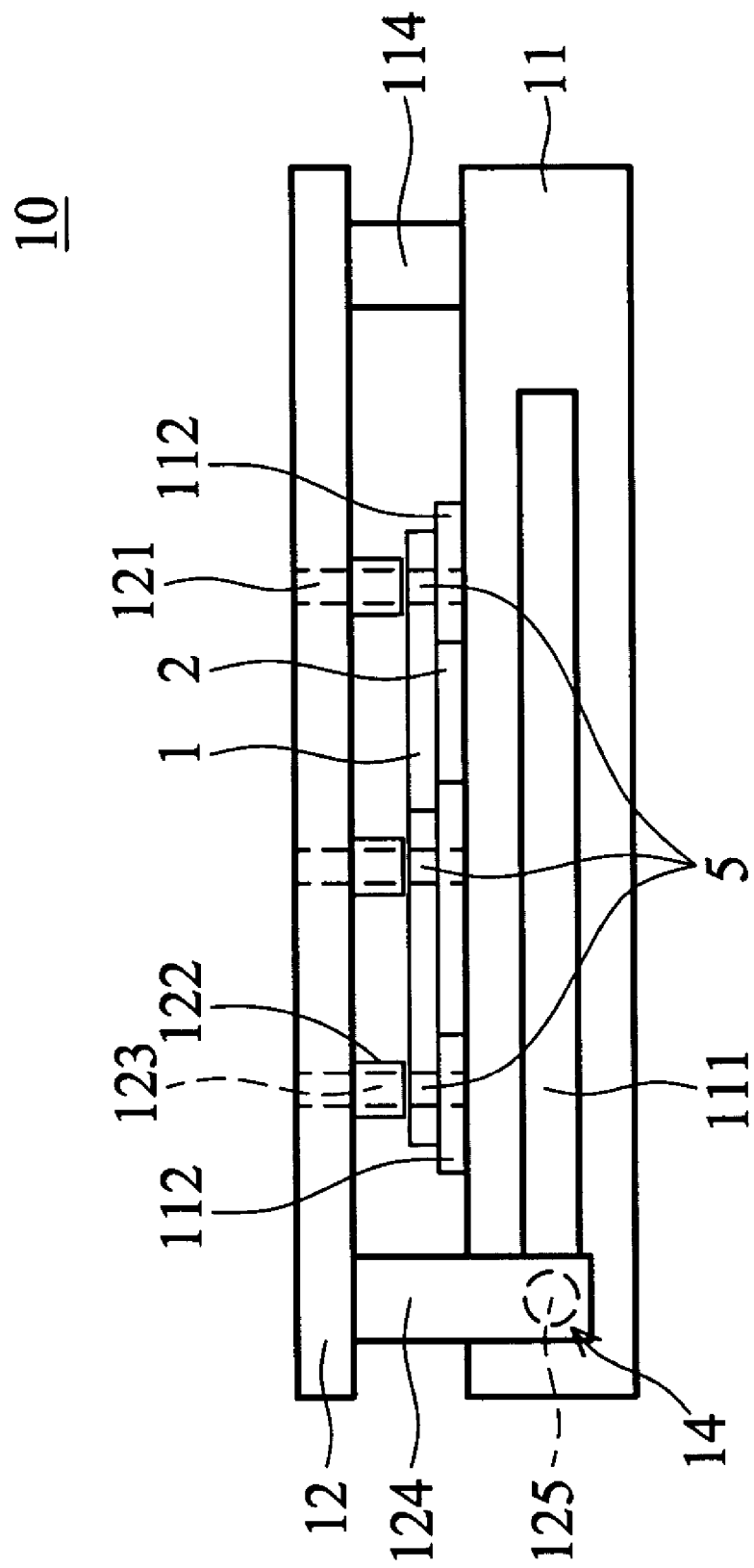
FIG. 1B is a schematic side view of the screw alignment tool of FIG. 1A with the cover in an operating position.

FIG. 1A shows the screw alignment tool in a first embodiment of the invention with a cover withdrawn. FIG. 1B is a schematic side view of the screw alignment tool with the cover in an operating position. The screw alignment tool 10 fixes two plane work pieces 1, 2, such as a printed circuit board (PCB) 1 and a fixing plate 2, for example. The PCB 1 and the fixing plate 2 have a plurality of screw holes 5.

In FIG. 1A, the screw alignment tool 10 comprises a base 11, cover 12 and a plurality of extending elements 122. The base 11 comprises a board with a plurality of positioning elements 112 disposed thereon according to the profile of the work pieces (1, 2), and fasteners 113, fixing the work pieces 1, 2. In addition, the base 11 also has two tracks 111 on two opposite sides, and side plates 114 on the other two sides respectively. The side plates 114 support the cover 12, and the cover 12 is connected to the base 11 by sliding arms 124 with protrusions 125 disposed in the tracks 111. Thus, the cover 12 can move between a withdrawn position 13 and a forward operating position 14 on the base 11.

In FIGS. 1A and 1B, the cover 12 comprises a plurality of holes 121 corresponding to the screw holes 5 on the work pieces 1, 2. The extending elements 122 made of plastic or metal are disposed by the holes 121 on the bottom surface of the cover 12. Each extending element 122 has a chute 123 communicating with the hole 121 of the cover 12. When the cover 12 is moved into the withdrawn position 13 as shown in FIG. 1A, the work pieces 1, 2 can be positioned on the base 11. When the cover 12 is moved to the forward operating position 14 as shown in FIG. 1B, the chutes 123 of the extending elements 122 align with the screw holes 5 of the work pieces 1, 2. By the help of the screw alignment tool 10 of the invention, screws (not shown) are thus aligned with the screw holes 5 efficiently, fixing the work pieces 1, 2.

Second Embodiment

Figure 2:
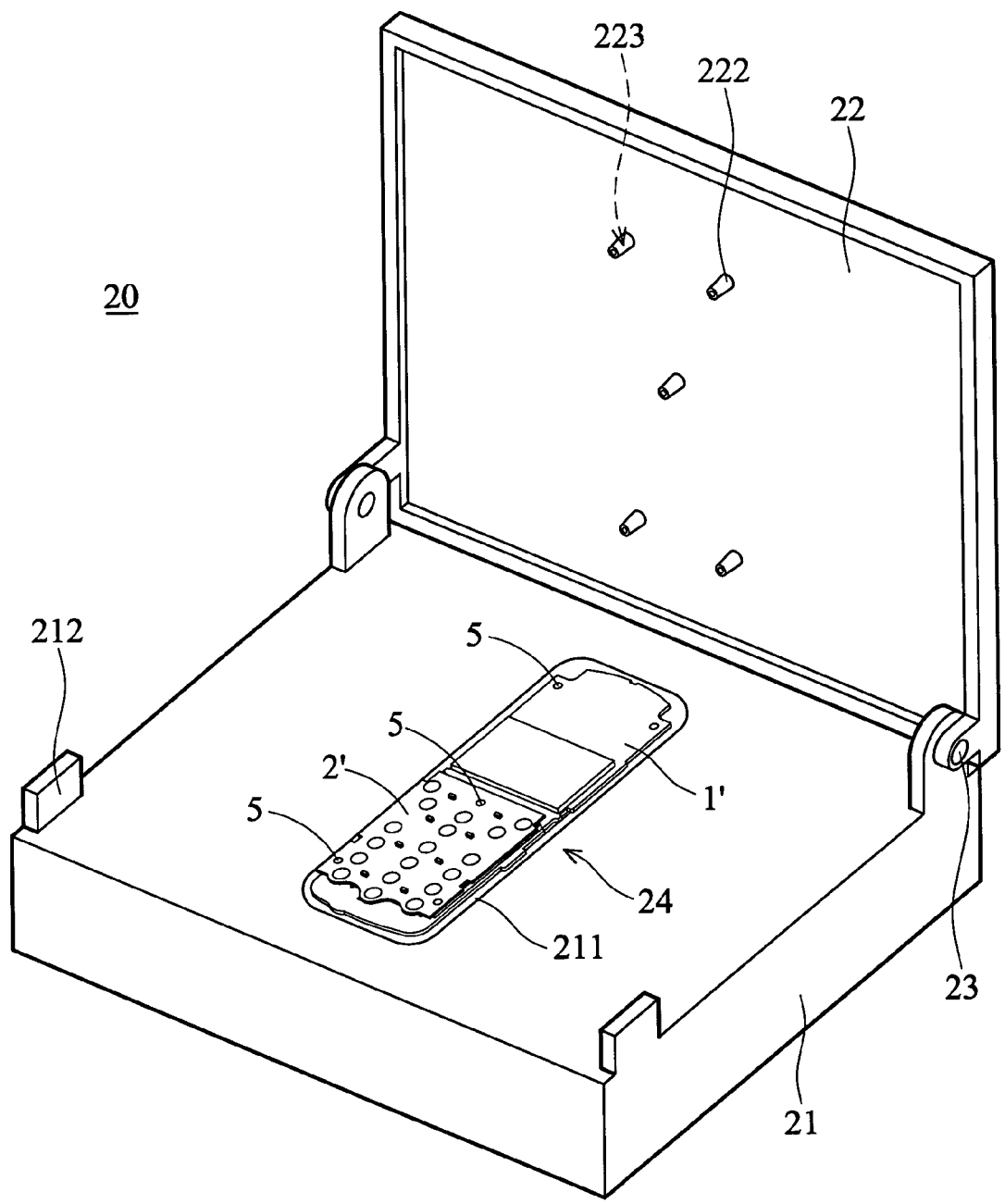
FIG. 2 is a perspective view of the screw alignment tool in a second embodiment of the invention.

FIG. 2 shows a screw alignment tool 20 with the cover withdrawn (opened). In this embodiment, the screw alignment tool 20 has a heavier base 21 for bulkier work pieces, such as components of a mobile phone 24.

In FIG. 2, the screw alignment tool 20 fixes a main PCB 1' and a keyboard module 2' of a mobile phone. The main PCB 1' and keyboard module 2' comprise a plurality of screw holes 5. The base 21 of this embodiment is heavier than the base in first embodiment and has a recess 211 matching the profile of the main PCB 1' therein. The cover 22 pivots on the base 21 by shafts 23, allowing rotation with respect to the base 21. In addition, the base 21 has side plates 212 on either side near the front edge. When the cover 22 is closed, the side plates 212 support the cover 22, preventing misalignment of the mobile phone 24 assembling.

Similar to the cover in the first embodiment, the cover 22 in this embodiment comprises as a plurality of holes (not shown) corresponding to the screw holes 5 on the main PCB 1' and keyboard module 2'. A plurality of extending elements 222 made of plastic or metal are disposed corresponding to the holes of the cover 22 and on the surface facing the base 21. Each extending element 222 has a chute 223 communicating with the hole of the cover 22. When the cover 22 is moved to the withdrawn (opened) position as shown in FIG. 2, the main PCB 1' and keyboard module 2' can be easily positioned in the recess 211 of the base 21. When the cover 22 is in the predetermined operating position (closed position), the chutes 223 of the extending elements 222 align with the screw holes 5 on the main PCB 1' and keyboard module 2'. By the help of the screw alignment tool 20 of this embodiment, alignment tool 20 of the invention, screws (not shown) are thus aligned with the screw holes 5 quickly, screwing the work pieces.

Figure 3A:
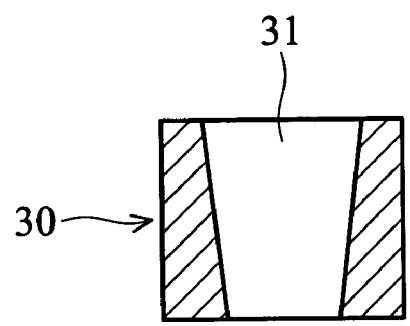
FIG. 3A~3C are cross sections of the preferred extending elements of the invention.
Figure 3B:
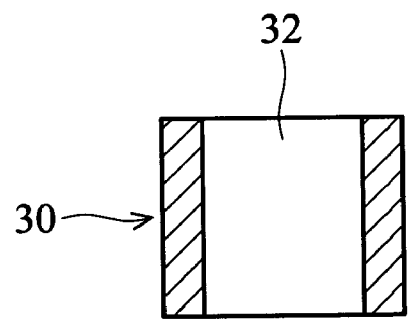
Figure 3C:
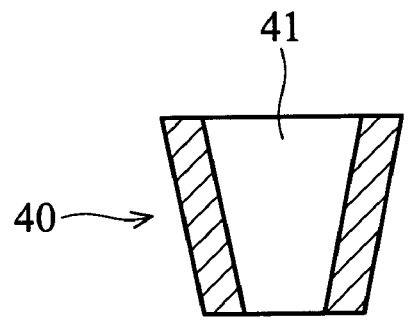

FIG. 3A~3C are cross sections of the preferred extending elements of the invention. When assembling large work pieces, each extending element can comprise a cylinder 30 with a circular through hole 32 as shown in FIG. 3B. When assembling small or dedicated work pieces, such as mobile phones, the through hole can comprise an inverse conical through hole 31 as shown in FIG. 3A, improving alignment precision. As well, when multiple components are crowdedly disposed the work pieces, a tapered extending element 40 with an inverse conical through hole 41 in FIG. 3C can be adapted to prevent interference therewith.

Accordingly, the screw alignment tool of the invention can adapt to different profiles of work pieces and screw holes therein, solving alignment problems during assembly and reducing fabrication time and cost.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An alignment tool for assembling work pieces with a plurality of screw holes, comprises:
   a base securing the work piece;
   a cover movably disposed on the base and having a plurality of through parts corresponding to the screw holes on the work piece;
   a plurality of tapered extending elements disposed on the cover corresponding to the through parts facing the base, wherein each extending element has a chute communicating with one of the through parts of the cover, and when the cover is moved to a predetermined operating position, the chutes align with the screw holes on the work piece.

2. The alignment tool as claimed in claim 1, wherein the base has a plurality of fasteners, fixing the work piece.

3. The alignment tool as claimed in claim 1, wherein the base has a track, with the cover slidably disposed on the base via the track.

4. The alignment tool as claimed in claim 1, wherein the cover pivots on the base.

5. The alignment tool as claimed in claim 1, wherein the extending elements are cylinders.

6. The alignment tool as claimed in claim 1, wherein the chutes are conical through holes.

7. The alignment tool as claimed in claim 1, wherein the chutes are circular through holes.

8. The alignment tool as claimed in claim 1, wherein the extending elements comprise plastic.

9. The alignment tool as claimed in claim 1, wherein the extending elements comprise metal.

10. An alignment tool for assembling work pieces with a plurality of screw holes, comprises:
    a base securing the work piece;
    a cover movably disposed on the base and having a plurality of through parts corresponding to the screw holes on the work piece;
    a plurality of extending elements disposed on the cover corresponding to the through parts facing the base, wherein each extending element has a chute communicating with one of the through parts of the cover, and when the cover is moved to a predetermined operating position, the chutes align with the screw holes on the work piece
    wherein the chutes are conical through holes.

11. The alignment tool as claimed in claim 10, wherein the base has a plurality of fasteners, fixing the work piece.

12. The alignment tool as claimed in claim 10, wherein the cover pivots on the base.

13. The alignment tool as claimed in claim 10, wherein the extending elements comprise plastic.

* * * * *